United States Patent [19]

Spitzer

[11] Patent Number: 5,491,338
[45] Date of Patent: Feb. 13, 1996

[54] HIGH RESOLUTION IMAGING AND MEASURING DYNAMIC SURFACE EFFECTS OF SUBSTRATE SURFACES

[76] Inventor: Richard Spitzer, 1214 Oxford St., Berkeley, Calif. 94709

[21] Appl. No.: 45,563

[22] Filed: Apr. 9, 1993

Related U.S. Application Data

[62] Division of Ser. No. 649,522, Feb. 1, 1991, Pat. No. 5,237,529.

[51] Int. Cl.$^6$ ................................................. H01J 37/00
[52] U.S. Cl. ................................................. 250/307
[58] Field of Search ................................. 250/306, 307

[56] References Cited

U.S. PATENT DOCUMENTS

| | | | |
|---|---|---|---|
| 2,911,627 | 11/1959 | Kilburn et al. | 340/174 |
| 4,100,563 | 7/1978 | Clark | 357/27 |
| 4,129,880 | 12/1978 | Vinal | 357/27 |
| 4,575,822 | 3/1986 | Quate | 365/174 |
| 4,607,271 | 8/1986 | Popovic | 357/27 |
| 4,683,429 | 7/1987 | Popovic | 324/225 |
| 4,918,309 | 4/1990 | Beha et al. | 250/307 |
| 4,941,753 | 7/1990 | Wickramasinghe | 250/307 |
| 4,998,016 | 5/1991 | Nose | 250/307 |
| 5,018,038 | 5/1991 | Nakanishi | 360/126 |
| 5,053,995 | 10/1991 | Kajimura | 365/151 |
| 5,075,548 | 12/1991 | Kajimura | 250/306 |
| 5,360,978 | 11/1994 | Gueret | 250/306 |

FOREIGN PATENT DOCUMENTS 8700959  2/1987  WIPO.

OTHER PUBLICATIONS

Clark, IEEE Solid–State Sensor and Actuator Workshop, Hilton Head Island, South Carolina, Jun. 6–9, 1988, pp. 72–75.
IEEE Solid–State Sensor and Actuator Workshop, Hilton Head Island, South Carolina, Jun., 6–9, 1988, various authors, various pages.
IEEE Workshop on Micro Electro Mechanical Systems, Napa Valley, California, Feb. 11–14, 1990, various authors, various pages.
Ong, Modern MOS Technology: Processes, Devices and Design, McGraw–Hill, Inc., 1984, pp. 207–216.
Marcus, et al., Applied Physics Letters, 1990, vol. 56, pp. 236–238.
Muller, Technical Digest of the 7th Sensor Symposium, 1988, pp. 7–11.
Muller, IEEE Micro Robots and Teleoperators Workshop, Hyannis, Massachusetts, Nov. 8–11, 1987.
Foxon, Interfaces, Quantum Wells, and Superlattices, Plenum Press, 1987, pp. 11–13.
Constant, The Physics of Submicron Semiconductor Devices, Plenum Press, 1983, p. 1.
Wood, The Physics of Submicron Semiconductor Devices, Plenum Press, 1983, pp. 179–184.
Wilkinson, et al., The Physics of Submicron Semiconductor Devices, Plenum Press, 1983, pp. 373–375.
Allen, Jr., The Physics of Submicron Semiconductor Devices, Plenum Press, 1983, pp. 581–589.

(List continued on next page.)

Primary Examiner—Bruce C. Anderson
Attorney, Agent, or Firm—Townsend and Townsend and Crew

[57] ABSTRACT

Methods of high resolution imaging and measuring dynamic surface effects of substrate surfaces is provided. The present invention utilizes electronic scanning with multiple scanning tunneling microscope (STM) tunnel-effect probes on an array that is stationary relative to the substrate surface. A high resolution image of the substrate surface is obtained by positioning an array of STM probes stationary relative to the substrate surface during the scanning process, selecting spatial points at which probes of the array of STM probes are to be activated, selecting times at which the selected STM probes are to be activated, activating the selected STM probes at the selected times, and measuring tunneling currents between the selected STM probes and the substrate.

11 Claims, 5 Drawing Sheets

OTHER PUBLICATIONS

Spitzer, proposal submitted to U.S. Dept. of Defense Small Bus. Innovation Research Program, Data Transfer for Magnetic Storage Information Without Macroscopic Motion, Dec. 26, 1989.

Spitzer, proposal submitted to U.S. Dept. of Defense Small Bus. Innovation Research Program, A Scanning Tunneling Microscope for Dynamic Surface Effects, Jun. 29, 1990.

Spitzer, proposal submitted to U.S. Dept. of Defense Small Bus. Innovation Research Program, Data Transfer for Magnetic Info. Storage Without Macroscopic Motion, Dec. 20, 1988.

Howe, et al., IEEE Spectrum, Jul. 1990, pp. 29–32.

Trompe, J. Phys. Condens. Matter, 1989, vol. 1, pp. 10211–10228.

Park, et al., Appl. Phys. Lett., 1986, vol. 48, p. 112.

Tang, et al., Appl. Phys. Lett., 1988, vol. 52, pp. 188–190.

Wickramasinghe, Scientific American, 1989, vol. 261, pp. 98–105.

Binnig, et al., Scientific American, 1985, vol. 253, pp. 50–56.

Jagielinski, MRS Bulletin, Mar. 1990, pp. 36–42.

Brodie, et al., The Physics of Microfabrication, Plenum Press, 1982, Chapter 6.

$$|B| = \frac{\mu_0 i}{2\pi W_r}$$

$i_{MAX} = 0.1A$

HIGH RESOLUTION IMAGING AND MEASURING DYNAMIC SURFACE EFFECTS OF SUBSTRATE SURFACES

This application is a divisional application of Ser. No. 07/649,522, filed Feb. 1, 1991, now U.S. Pat. No. 5,237,529.

BACKGROUND OF THE INVENTION

The present invention relates primarily to the field of semiconductor and microstructure devices and their fabrication, and more particularly to a method of and apparatus for data storage and data transfer that limits or eliminates the need for motion of macroscopic electromechanical elements in one particular embodiment.

Much as the transistor replaced the vacuum tube, various other electronic functions are now being replaced by solid state devices. The attendant rate of miniaturization now allows one to make wires and other features that are as thin as 20 nm. Devices that have been produced range in size from micron to submicron. These microscopic sensors and actuators will be referred to hereinafter as microdevices. Important applications include microrobots for uses ranging from industrial production to microsurgery; optical devices for the generation, modulation and sensing of light; and complete microsystems for biological and chemical processing.

The focus has been on physical, chemical, and biological microstructures for use in microsensors, transducers, tactile and vibrational sensing arrays, and membranes. The capability required for fabricating such small devices has been enabled by advances in lithography, molecular-beam epitaxy, and metal/organic vapor deposition. These materials-processing and microfabrication techniques have been combined successfully with the technology of semiconductor manufacturing to produce various microdevices capable of functioning as electromagnetic sensors and actuators. Microdevices are disclosed in, for example, the proceedings of the-"IEEE Solid-State Sensor and Actuator Workshop," Hilton Head Island, South Carolina, Jun. 6–9, 1988; "IEEE Workshop on Micro Electromechanical Systems," Salt Lake City, Utah, 20–22 Feb. 1989; and "IEEE Workshop on Micro Electro Mechanical Systems," Napa Valley, Calif., 11–14 Feb. 1990, all of which are incorporated herein by reference for all purposes.

The steps required for the fabrication of microdevices integrated with microelectronics on a chip or as a hybrid are well known to those skilled in the art. For example, the technique is being used to construct the entire transducer for a scanning tunneling microscope on a silicon chip, as described in Kenny et al., "A Micromachined Silicon Electron Tunneling Sensor," IEEE (1990), previously incorporated herein by reference for all purposes.

Electronic mass storage devices such as floppy disc drives, hard drives, and magnetic tape are well known. Three factors have provided the driving force in the quest for ever improved electronic mass storage: high information density, short access time, and long-term stability. The dominant technology for electronic-data mass storage over the past thirty years has been magnetic recording. The success of magnetic storage technology can be attributed at least in part to steady advances in providing the desired data capacity (for example, $10^7$ bits/cm$^2$ on commercially available disks, and one order of magnitude larger on a recent demonstration disk) at a competitive price, albeit at the loss of speed, and to its substantially unlimited number of erasure cycles.

While meeting with substantial success, difficulty has been encountered in providing a technology that performs satisfactorily with respect to all three factors. A typical design of the storage hierarchy involves tradeoffs, as a result of which most systems include a combination of (expensive) semiconductor memories, to provide a better match to the processor speed, and (slower) magnetic storage, to provide larger capacities for long-term storage.

The basic elements of a magnetic storage system comprise a magnetizable storage medium, a transducer that can write information to and/or read information from this medium, means for the medium and transducer to move with respect to each other, and suitable associated electronics. In a magnetic recording system, the transducer is called a head. The two most commonly used head technologies are based on inductive and flux-sensing methods and are described in, for example, Mee et al., *Magnetic Recording Handbook*, McGraw-Hill, 1990, which is incorporated herein by reference for all purposes.

The inductive head in a magnetic record/erase system includes a coil of wire wound around a magnetic core, and it relies on Faraday's law of induction. In the read process, the relative head/medium motion causes the head to pick up the time rate of change of the medium magnetization in the transition region, which induces a current in the coil. In the write process, a current passing through the coil creates a magnetic field in the head which is used to impress magnetized regions onto the storage medium. Unlike the inductive read transducer, the flux-sensitive read transducers do not require any motion relative to the storage medium. Flux-sensitive transducers include those based on a change in resistance (magnetoresistive effect), change-in electric field (Hall effect), and modulating the reluctance of a ring core (flux gate). Much of the remaining description of read transducers herein relies on magnetoresistive transducers; this is not intended to be limiting. The magnetoresistive head relies on the changes in resistance of a magnetic material that accompanies a change in magnetization. It depends on the magnetic flux itself rather than on the rate of change-of flux, as is the case with inductive heads; its output therefore depends only on the instantaneous fields from the media and is independent of the relative head/medium velocity or the time rate of change of the magnetic flux. The sensing element is biased with a magnetic field to optimize the linearity of its output. Many biasing schemes have been utilized, the largest class of which provides the biasing field through an auxiliary microstructure in close proximity to the magnetoresistive element. Furthermore, it is a read-only device, so that it has to be combined with an inductive write head. Magnetoresistive tape heads are available commercially, disk heads, on a demonstration basis.

Despite its dominant position, magnetic-storage technology suffers from several basic problems, arising mainly not from storage itself but rather from the present method of transfer of data between mass storage and the computer by means of moving heads. Disadvantages include:

(1) The relatively slow speed of access. It takes on the order of tens of milliseconds to transfer a block from disk storage.

(2) It is vulnerable to shock and vibration.

(3) Materials problems arising from the relative head/medium motion. Materials choices generally represent a compromise between the desired electrical performance and tribological (wear and friction) constraints.

(4) The practical limitation on the density of magnetic storage is currently set by the size of the read/write head; it is presently two orders of magnitude short of the theoretical limitation in many embodiments. In principle, each magnetic domain can encode one bit. In practice, locating or addressing individual domains presents problems that have proven insurmountable to date, because of the size of the head. Practical considerations normally dictate that in magnetic-recording systems based on prior-art head/disk technology each bit contains a large number of domains, which precludes reaching the theoretical storage capacity.

(5) The magnetization in the direction normal to the surface of the medium falls off exponentially with distance. There is a corresponding loss of sensing signal with increased head/medium spacing. Designs thus represent a compromise between the close spacing essential for high-density storage and the need to maintain the stability required to avoid contacts.

Computer applications require large amounts of data transfer between internal computer memory and an external storage device, such as a disk. There is generally a large disparity between the internal processing speed of the computer and speed of input/ output (I/O). Typical computer instruction times range from the order of a microsecond down to tens of nanoseconds; a typical operation to transfer a sector of data is of the order of tens of milliseconds. Although comparison between the transfer of a sector and a single instruction is clearly not a direct measure of the relative times required for I/O and for processing, it is well known from practical experience that typical I/O times in data-transfer-intensive applications can be several orders of magnitude longer than typical CPU processing times. This large speed disparity between processing and I/O reflects the vast difference between the time constants that characterize these two functions. CPU processing time is dictated by transistor switching times, which are orders of magnitude shorter than the characteristic times of motion of the macroscopic electromechanical parts essential to prior-art head/ disk mass storage systems. In such applications, I/O, not processing time, is the limiting factor in throughput. Overcoming this critical limitation in the overall speed of computing is one of the major problems in computer-system design.

Magnetic disks store data in concentric circles called tracks. Digital data are stored serially around the track. Each track is divided into sectors. A sector is a group of contiguous bits, which are generally transferred between memory and disk in one I/O operation. The data are accessed by read/write heads mounted on the ends of access arms. In most disk units, the heads are positioned over a given sector by a combination of two mechanical motions: the disk rotates to provide angular position, and the access arm moves radially to provide radial position. The combination of disk rotation and access-arm motion allows the head to be positioned over any point (any sector of a disk and track) of a disk.

Accordingly, the time required to move data between a disk and internal computer memory (access time) has three major components. These components represent three separate actions in the data storage and retrieval process.

(1) Seek time (or access motion time) is the time required for the access arm to position its read/write head over the proper track.

(2) Rotational delay (or latency) is the time it takes for the rotating disk to bring the desired sector under the access arm.

(3) Data transfer time (or data movement time) is the time required to transfer data between the disk and main memory.

The access time required to read (or write) on the disk is the sum of the three times:

access time=seek time+rotational delay+data-transfer time

The sum of the average seek time and rotational delay is referred to hereinafter as positioning time:

positioning time=seek time+rotational delay

As indicative of typical times, the HP 7935H has an average seek time of 24 ms, rotational delay of 11.1 ms, and data-transfer time of 1.0 ms for a kilobyte sector; the corresponding times for the IBM 3380 are 16 ms, 8.3 ms, and 0.33 ms, respectively. The average positioning time, which is seen to be 30–80 times longer than the actual data-transfer time from a sector, is clearly the limiting factor in access time.

The technology of data storage and retrieval by prior-art magnetic-storage systems relies on the relative motion of the head and the storage medium. During transport of the recording medium past the head the relative motion of the two permits writing or reading; in general, this motion causes a transfer between a temporal signal in the read/write head and a recorded spatial pattern in the medium.

The fundamental process, in which temporal input data are translated into a recorded spatial magnetization pattern in the medium during a write, involves several steps.

(1) Information (audio, video, or data) to be recorded magnetically is encoded as a time-varying electrical signal.

(2) The signal current with the encoded pattern is applied to the writing-head windings.

(3) This current magnetizes the head.

(4) The fringe magnetic field from the head creates, on the moving medium, a spatially varying pattern of magnetization that reproduces the pattern encoded in the electrical signal.

The reading process uses either the same head or another head to reconvert the recorded magnetization pattern into a time-varying electrical signal that can be amplified to a useful level, for example, to feed data to a computer or to drive a loudspeaker or a receiver.

The rotation of the disk past the head actually serves a dual role in these devices.

(a) In the read process, the motion of the windings in the head through the magnetic-field lines from the storage medium generates current in these windings. This is the fundamental mechanism underlying the actual transfer of a given bit between the medium and an inductive head. This aspect of the motion does not come into play for a magnetoresistive head.

(b) The relative motion of the head along the track accesses the data in the sector serially. In the recording process, this produces a magnetization pattern according to the input current applied to the head. If the input signal is at a frequency f and the medium is moving at a relative velocity v, a magnetization pattern ($0s$ and $1s$) will be recorded at a fundamental wavelength given by $$\lambda = v/f. \tag{1}$$

In general, all temporal signal variations are translated into spatial variations by the relation $$x = vt, \tag{2}$$

where x denotes the pattern coordinate along the medium and t is the temporal coordinate of the input signal. This aspect of the head/medium motion is required for both inductive and magnetoresistive heads.

In addition to their dependence on the speed v, the phenomena associated with the write process depend, among other parameters, on the head-medium separation d (otherwise known as the flying height). See, for example, "Special Section on Magnetic Information Storage Technology," Proceedings of the IEEE, November 1986, Vol.74, which is incorporated herein by reference for all purposes. Apart from differences attendant to the head functioning as a sensor rather than as an actuator, the signal produced when the medium is read is a function of most of these same parameters, including v and d.

Semiconductor random access memories (RAMs) are also well know to those of skill in the art. A RAM generally comprises a set of memory cells integrated on a chip with a number of peripheral circuits. RAMs are described in, for example, Porat et al., *Introduction to Digital Techniques*, John Wiley, 1979, which is incorporated herein by reference for all purposes. In general, RAM circuits perform several functions, including addressing (selection of specific locations for access), providing power, fanout (transmission of a signal to a multiplicity of directions), and conditioning required to generate a useable output signal. In RAM memories, the addressing scheme permits direct access to the desired cell, with access time independent of the cell location. Selected portions are then extracted for use. RAMs are generally fast enough to be compatible with a CPU, but they are generally too expensive to be used for mass storage. Further, RAMs are generally volatile in the sense that a source of power must be provided to refresh the memory periodically. They cannot, therefore, be used for long-term storage. One alternative to RAM includes ROM such as EPROMs (Electronically Programmable Read Only Memory). While such memories do not require a refresh cycle, they have the obvious disadvantage of being programmable only once. Other nonvolatile semiconductor memories that can be written repeatedly, such as EAROM (Electrically Alterable Read Only Memory) or EEROM (Electrically Erasable Read Only Memory), do not provide nearly the reliability of magnetic memories for long-term storage.

The scanning tunneling microscope (STM) is an instrument used for measuring surface properties. It comprises a sharp needle, usually made of tungsten, that can probe the electronic structure of conducting surfaces by means of the tunneling effect. The probe is placed in close proximity to the surface and physically scanned over it. The instrument provides a tool for characterizing static surface properties of, for example, conductors. It is unique in providing surface information on an atomic scale and has opened opportunities in applications ranging from biological systems to telerobotics. Derivatives of the STM have extended the capabilities of tunneling sensors to the measurement of nonconducting as well as conducting surfaces.

There are however whole classes of phenomena involving transient surface effects that are of wide interest but which take place on vastly shorter time scales than the time needed to scan a surface physically by an STM probe. Many of these effects bear directly on the development of new electronic materials, devices and circuits. There is thus a need to develop novel methods for the measurement of dynamic surface effects that derives from the confluence of several factors: the importance of their application; the facts that surface properties are in general significantly different from and not nearly as well known as bulk properties; and the difficulty of measuring dynamic surface effects on an atomic scale by conventional methods.

From the above it is seen that improved transducer arrays are desired.

SUMMARY OF THE INVENTION

An array of submillimeter transducers (sensors/actuators) are formed with support electronics on a chip or as a hybrid, wherein the individual transducers act at specifically selected positions and times for reading or writing data on a storage medium. An addressing scheme provides access to any individual transducer directly, with access time substantially independent of the transducer's location in the array. The individual transducers on the array are activated at selected addresses and specifically related times and their actions are converted electronically into a function of the transducer system as a whole. The choices of the positions and times at which the transducers are activated are determined by the particular application of the transducer array. A further understanding of the nature of these choices may be had with reference to the following specific embodiments of the invention.

According to one embodiment, the invention utilizes magnetic storage technology with the intrinsic speed of electronic switching that characterizes access to semiconductor memories. This is accomplished by replacing the macroscopic moving head that currently serves as the read/write transducer for magnetic storage by an array of interconnected submillimeter magnetic transducers on a chip.

In one preferred embodiment, the invention performs data transfer by a combination of (i) suitably interconnected submillimeter transducers capable of sensing and/or actuating microscopic data-storage cells, and (ii) electronic switching to activate selected individual transducers. The spatial points at which the transducers are activated are the ones corresponding to the memory locations that are to be read or written. The times at which the selected transducers are activated are chosen to be substantially the same so that an entire block of data can be moved at a time. In a preferred embodiment, the electronically switched devices transfer data to and from the selected transducers at substantially the same time. According to one aspect of the invention, the transducers are interconnected in an array with electronics for coordinated operation of the array as a whole, with capabilities that are unavailable to the transducers acting alone, by activating selected individual transducers at specific times.

According to another aspect of the invention, an array of scanning-tunneling-microscope probes is utilized in the measurement of dynamic surface effects by performing the surface scanning electronically rather than physically. The selection of spatial points at which the probes are activated is determined by the points over which the dynamic effect to be measured propagates. The times at which the selected probes are activated are chosen to coincide with the propagation of the effect over the selected spatial points.

A further understanding of the invention may be had with reference to the following description and drawings.

BRIEF DESCRIPTION OF THE DRAWINGS

FIG. 4b depicts an alternative transistor/diode configuration of the circuit of FIG. 4a;

FIG. 4c depicts an alternative transistor/diode configuration of the circuit of FIG. 4a;

DETAILED DESCRIPTION OF THE PREFERRED EMBODIMENTS

CONTENTS

Figure 1:
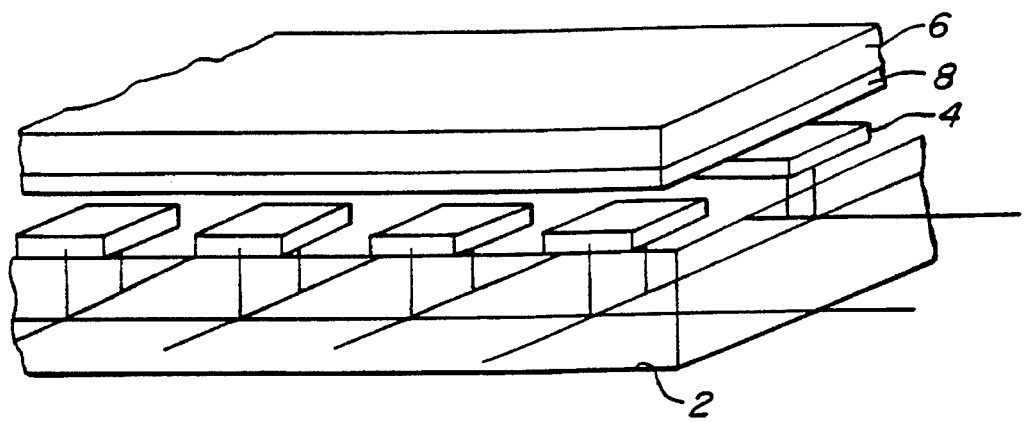
FIG. 1 is an overall block diagram illustrating the invention.

I. Definitions
II. General
III. Magnetic Data Storage Array
 A. Stationary Embodiment
  1. Write Transducers
  2. Read Transducers
 B. Micromachine Embodiment
 C. Write/Read Circuitry
 D. Fabrication Process Flow
 E. Representative Applications
IV. Scanning Tunneling Microscope Array
V. Conclusion
I. Definitions As used herein, the following terms are intended to have the following general meanings:

"Transducer" means a submillimeter device used to sense (measure a physical quantity such as pressure, magnetic field, moisture, etc., of a system) and/or activate (impress a physical quantity on a system). Among transducer systems used according to preferred apsects of the invention are arrays of transducers used to sense one or more characteristic of a recording material such as magnetic material so as to detect the presence or absence of a data bit on the recording material and to activate one or more characteristic on a recording material so as to impress the presence or absence of a data bit on the recording medium; and arrays of STM probes used to measure dynamic surface effects.

"Magnetic transducer" means a transducer that creates magnetization for recording or senses magnetization fields for reading.

"Activation" refers to the steps of addressing a transducer and the operation of a transducer to perform its selected function. In the specific example of MAGFETs, activation would refer to the steps of addressing a MAGFET and operating the MAGFET to sense the surrounding magnetic field. In the specific case of a magnetic coil, as another example, activation refers to the steps of addressing the coil and flowing a current through the coil to provide sufficient magnetic fields for formation of a "0" or "1" on a magnetic material. In the specific case of magnetoresistive elements, activation refers to addressing and sensing of the resistivity of the element, which will vary depending upon magnetization.

II. General

This invention combines submillimeter transducers or microdevices with electronics on an array to produce an integrated transducer system with the capability to perform novel functions for use in a variety of applications. The transducers are individually selected to act at specific spatial points on the array, and the time at which each selected transducer acts is specifically related to the times and points at which the other selected transducers act. These novel functions are in general unavailable when the individual transducers act alone, when they act collectively at specific spatial points but at times that are not specifically related to one another or to the points, or when they act at specific times but at spatial points that are unrelated to each other or to the times. The microdevices may be of two general types: with microscopic mechanical motion such as, for example, vibration or rotation, or without such motion. The choice of transducers, of the time at which they act, and of the position at which each selected transducer acts depend in general on the function to be performed by the transducer array.

The invention combines advanced materials-processing and microfabrication techniques with contemporary integrated-circuit technology to produce an array of submillimeter transducers (sensors/actuators) integrated with support electronics on a chip or as a hybrid, wherein the individual transducers act at specifically selected positions and times to provide a transducer system with new capabilities. An addressing scheme provides access to any transducer directly, with access time independent of the transducer's location in the array. The individual transducers on the array are activated at selected addresses and specifically related times and their actions are converted electronically into a function of the transducer system as a whole.

According to one embodiment, the invention combines the principal advantages of magnetic storage technology with the intrinsic speed of electronic switching that characterizes access to semiconductor memories. This is accomplished by replacing the macroscopic moving head that currently serves as the read/write transducer for magnetic storage by an array of interconnected submillimeter magnetic transducers on a chip and eliminating or reducing the motion of the storage medium. The result is a fast, robust, maintenance-free, compact and reliable all-electromagnetic, long-term, mass-storage system.

In one preferred embodiment, the invention performs data transfer by a combination of (i) suitably interconnected submillimeter transducers capable of sensing and/or actuating microscopic data-storage cells such as magnetic data storage cells, and (ii) electronic switching to activate selected individual transducers for reading and writing the data stored thereon. In a preferred embodiment, the electronic switching devices transfer data to and from the activated transducers at substantially the same time.

A particular implementation of the method of this invention applies to the transfer of data to and from various kinds of mass-storage media. In this implementation, an array of microdevices integrated with electronics on a chip, or as a hybrid, is organized for direct access to any individual transducer, with access time largely independent of the transducer's location on the array and with each transducer capable of transferring one or more data bits to or from its corresponding location on the storage medium. The array is placed in close proximity to the storage medium and individual transducers at specifically selected locations are activated electronically at substantially the same time to transfer collectively a block of data to or from the medium. Such a transducer system, comprising an array of individual submillimeter transducers interconnected electronically to function as a whole and capable of transferring blocks of data at a time to and from mass storage when functioning as a whole, will be referred to herein as a transfer board. In the particular case of a magnetic storage medium, the activated microdevices are collectively capable of inducing magnetization in the storage medium according to an input signal containing encoded data (write operation) and, conversely, capable of sensing the magnetization pattern in the storage medium to produce an output signal containing the recorded data (read operation). Other memory technologies (such as, for example, magnetooptic, phase change, bump forming, —using arrays of laser diodes—or superconducting) can also serve as the storage medium, and reference to a magnetic medium is not intended to be limiting.

According to preferred aspects of the invention, the storage medium can be the same as or compatible with those of the present art such as floppy discs or hard discs. The head of a conventional read/write system is replaced by submillimeter transducers which are interconnected by means of suitable electronics into an array that functions as a whole, and the magnetizable medium and the transducer array as a whole do not move with respect to each other during data transfer, although in some embodiments the invention may allow for limited motion for alignment or positioning over blocks of data prior to data transfer.

The invention, as applied to the transfer of data between computer memory and a mass-storage device, overcomes the shortcomings and disadvantages of prior-art mass-storage technology by using an array of microdevices as a means of accomplishing the data transfer to produce a mass-storage system with improved capabilities. For example, access time will be reduced, in some embodiments by several orders of magnitude, without losing the advantages of magnetic recording, by eliminating or reducing the two types of macroscopic mechanical motion that account for the positioning time in devices based on disk-drive technology, and thereby eliminating positioning time itself. In devices based on the present invention, the combination of a rotating data disk and access arm of a standard disk-drive system is replaced by two stationary adjacent disks: a-state-of-the-art data disk and the transfer board. Conceptually, the transfer board and storage medium are distinct components that are to be suitably adjoined. Physically, the two may be manufactured together by a single fabrication process on a single substrate to form a single unit. This is the case for a particular embodiment of the invention. In alternative embodiments the data disk and magnetic storage media are fabricated as separate units. In general, whether the transfer board and storage medium are to be manufactured as a single unit or in separate processes and then joined will depend on the type of storage medium, the read/write transducers and the materials.

The time required for data transfer is reduced for I/O by several orders of magnitude, in some embodiments, with an attendant improvement in computing speed for all applications that require extensive I/O. Since neither the data disk nor the transfer board moves or movement is greatly reduced, they need not be circular in shape, though it is most efficient if they have the same shape. Since the transfer board is stationary with respect to the storage medium, materials-related problems due to head/medium motion are reduced. There is no need or reduced need to protect against wear and friction, so that tribological issues are of substantially reduced importance in the choice of data storage materials, which can now be optimized for their electromagnetic properties. Further, the problems attendant to locating and addressing a small number or individual domains by a macroscopic head are reduced.

In one embodiment of this invention, the location of a given information cell on the storage medium is established by the specific transducer in the transfer board that writes to and/or reads from the information cell. The minimum number of domains that can encode one bit is established in the method of this invention by the number of domains interacting with a single microdevice in the read/write processes. It is characteristic of the transfer-board concept in general that it does not require the tranducers on the board to be positioned with respect to the memory locations each time data are to be transferred. The location of a given information cell on the storage medium is established by the specific transducer that writes to and/or reads from this information cell. Each microdevice defines its corresponding information cell, the relative positions of each information cell on the storage medium, and its corresponding transducer on the transfer board being fixed. Each information cell is thus accessed through its interaction with its unique corresponding transducer, which is in turn accessed directly by means of the electronically implemented addressing scheme. In other words, the transfer board is self-aligning with respect to the magnetic medium. This is in qualitative contrast to the case of prior art disk drives, where the head must be positioned accurately each time it is to read or write. By eliminating those problems of locating and addressing individual magnetic domains that arise from the macroscopic size of the moving head which serves as the read/write transducer in devices based on disk-drive technology, the door opens to a storage system in which each magnetic domain encodes one bit, and an attendant increase of two orders of magnitude in the storage density.

The motion-related limit on the minimum separation of the read/write transducer system from the storage medium is reduced or eliminated according to certain aspects of the invention. The absence or reduction of relative macroscopic motion between the data disk and the transfer board allows the disk/board separation to be decreased significantly compared to what it is for disk drives. Such a decrease, in turn, permits the sensor/actuator to function with significantly weaker signals.

A mass-storage system based on a transducer system comprising an array of microdevices on a chip, to replace the mechanical motion of disk drives and rotating disks, therefore not only results in vastly increased speed of computing, but also removes the primary limit to the growth of magnetic storage capacity by upwards to two orders of magnitude.

Another particular implementation of the method of this invention applies to the measurement of dynamic surface effects on an atomic scale. This implementation uses electronic scanning with multiple STM tunneling-effect probes on an array, in lieu of the physical scanning by means of single-probe devices, to overcome the limitation of the single-probe scanning tunneling microscope (STM) and its generalizations of prior art, which measure only static properties. In the implementation of the method of this invention, an array of single probes integrated with electronics on a chip or as a hybrid is organized for direct access to any individual probe, with access time substantially independent of the probe's location on the array and with each probe capable of sensing the distance from the surface by means of the tunneling effect. The array is placed in close proximity to the surface, and individual probes at specifically selected spatial points on the array are activated electronically at times chosen to coincide with the propagation of dynamic effects over these selected spatial points, so as to measure the dynamic effects. It is anticipated that, prior to the measurement of dynamic effects, the tips in the array will first be adjusted to a previously measured static surface contour, but this is not required for the application of the method.

III. Magnetic Data Storage Array

A. Stationary Embodiment

FIG. 1 is an isometric view of one embodiment of the invention. The invention includes a suitable substrate 2 on which a plurality of transducers 4 are placed or formed. Adjacent to or in contact with the transducers 4 a second substrate 6 is provided. On at least one surface of the second substrate, a recording surface 8 is formed. Each of the cells-transducers plus electronics-preferably occupies an area of less than about 1,000 $\mu m^2$, preferably less than about 100 $\mu m^2$, and most preferably less than about 10 $\mu m^2$. In some embodiments, the transducers are formed in arrays having a cell density of greater than about $10^5/cm^2$, with densities of $10^6/cm^2$ preferred, and densities of about $10^7/cm^2$ most preferred.

According to one preferred embodiment of the invention the transducers 4 are magnetic transducers. According to one specific embodiment of the invention, the magnetic transducers are adapted to sense the magnetization of the recording material. Magnetic transducers suitable for this purpose include split drain magnetic field sensitive metal oxide semiconductor field effect transistors (MAGFETs). Such devices fabricated in an array are disclosed in, for example, Clark, "CMOS Magnetic Sensor Arrays," IEEE TH0215-4/88/0000-0072 (1988) which is incorporated herein by reference for all purposes. Other transducers suitable in connection with the invention include magnetoresistive strips of the kind used to write in the heads (described in Jagielinski, "Materials for Future High Performance Magnetic Recording Heads," MRS Bulletin, March 1990, incorporated herein by reference); microcoils such as those disclosed in Ehrfeld, "LIGA process: Sensor Construction Techniques Via X-Ray Lithography," IEEE Solid State Sensor and Actuator Workshop, Jun. 6–9, 1988, which is also incorporated herein by reference for all purposes; and crossed wires such as those shown in FIG. 2a. According to these embodiments the recording surface 8 is a magnetic recording material of the type known to those of skill in the art. Suitable magnetic recording materials include, for example, iron oxides ($\gamma$-$Fe_2O_3$), barium ferrite ($BaO \cdot 6Fe_2O_3$), and rare-earth ferrites. According to the embodiments illustrated in FIGS. 2a and 3, the read and write transducers are deposited directly on the magnetic storage medium. In alternative embodiments, the substrate and the recording material are preferably separated by between about 100 nm and 300 nm, and preferably about 20 nm. Each transducer corresponds to the location at which a single bit of data is recorded and/or written on the recording media.

Typically, the recording medium is comprised of magnetic particulates suspended in a thin-film nonmagnetic binder. Both ferromagnetic and ferrimagnetic films can be applied to recording applications.

Several parameters play an important role in characterizing the performance of a magnetic recording medium. The magnetization M is a bulk property of the medium; the applied magnetic field is denoted by H. The saturation magnetization $M_s$ is the limiting value approached by M at high H fields. The remanent magnetization $M_r$ is the maximum value of M that the material can retain at zero H field; it therefore correlates with the field available for sensing in the read process. The H field required to reduce the component of M in the direction of H to zero is called the coercivity $H_c$.

In addition, the magnetizable medium is characterized by regions of uniform magnetization, called magnetic domains, with values equal to $M_s$. Each domain has two stable directions (states) magnetization, which provide the binary property of the storage medium and which can be switched by a sufficiently strong field H. The minimum field required to change the direction of domain magnetization is called the switching field and is on the order of the coercivity. Bits are recorded as a sequence of regions of opposite magnetization.

There are five major considerations in selection of media herein:

(1) The medium should be sufficiently sensitive to magnetize in the write-transducer fields.

(2) The medium should also retain sufficient magnetic remanence resulting from the write operation to create an inductive field which produces a measurable resistivity change in the read transducer.

(3) The coercivity of the medium should be such that the direction or presence of magnetization in the data storage cell can be easily reversed between its two states (i.e., the binary states switched) by the write transducer.

(4) The recording medium should have no electrical interaction within the read/write transducer circuitry. This is especially important with consideration to the increase in mutual inductance which will be caused by the presence of this magnetic medium near the inductive write transducer: if that increase is too high, the write operation may not have sufficient operating speed.

(5) A final requirement has to do with the two types of patterns of magnetization, longitudinal and perpendicular (or parallel), that magnetic media can support. Both the read and write transducers selected for the design rely on magnetic fields perpendicular to the storage medium. The medium in such a design must therefore be able to support magnetization components normal to its surface.

There are approximately twenty popular materials, both ferromagnetic and ferrimagnetic, used for magnetic disk and/or tape media. Most of these materials are optimized for their microtribological properties since existing mass-storage systems require read/write head motion over the storage medium. The system herein is fixed and therefore is not under the constraints relevant to disks or tapes. Consequently, there is a very large number of possible thin-film data-storage materials available for our use (although, by design, the medium must be ferrimagnetic in most embodiments).

One example of a suitable medium is the barium ferrite group of materials. These materials are well understood, inexpensive, easy to deposit as thin films (by all common techniques), stable at room temperature, and noncontaminating. One example is $BaO \cdot 6Fe_2O_3$ ("Ferrite 3"). This material is used already for some recording applications. It has a magnetization of 3.2 kG, a coercivity of 3,000 Oe, and a critical temperature of 450° C. There are numerous constituency variations for the family of barium ferrites, which all have slightly differing properties. This makes it possible to select a particular ferrite that matches the fields within the particular cell structure. One other notable advantage of the barium ferrites is their ability to be deposited by sputtering in submicron particulate form (<=0.1 μm); these materials can also be patterned without dissociating.

For some embodiments, storage materials with coercivity in the range of 300–500 Oe are desirable; there are many such magnetic materials. However, for materials with such relatively low coercivity, the entire package will most likely have to be magnetically shielded against the environment.

Each of the transducers are connected to a word line 10 and a bit line(s) 12. The word line 10 and bit line(s) 12 are connected to the transducers to provide appropriate voltage or current signals for operation of selected transducers.

1. Write Transducers

The storage of individual bits is accomplished by magnetizing the thin-film magnetic storage medium using a write transducer. This transducer is simply a source of magnetic field, H, with sufficient magnitude to orient the domains of the storage medium within a specific storage node, leaving a remanent magnetic induction in the medium after the field is no longer applied. In the case of binary data storage, it is sufficient that the storage medium be simply magnetized in one of two directions in the individual storage cells in order to distinguish between the 1 or 0 states. The difference between the two magnetized conditions only needs to be sufficient to be unambiguous during the detection (i.e., the read) process. Absolute values of the remanent induction field are constrained only by the sensitivity of the transducers and the support electronics. The write transducer can be any type of structure which produces an anisotropic reversible magnetic field. Typically, the transducer is a current loop, coil, or other inductor.

The constraints for an inductive write transducer are generally as follows:

(1) The transducer should be made of a low-resistance conductor so that it neither dissipates significant power, nor creates LCR oscillations within the bandwidth of the overall recording system.

(2) The write transducer needs to interface with the support electronics; specifically, practical electrical signals must be easily translated to sufficient magnetic fields within the frequency requirements of the recording system.

(3) The write transducer must be minimally coercive or, preferably, nonmagnetic. This is important for the switching operation to function properly; otherwise, the recording medium would feedback to the write transducer and the mutual inductance of the transducer would both slow the system operation and cause unwanted interaction with adjacent storage cells.

(4) The write transducer must produce high reversible magnetic fields, without retaining any substantial remanent magnetization.

(5) The write transducer needs to be a low-noise device in order to eliminate any ambiguity in the binary write operation. This is especially important in a microstructural recording array of the kind proposed in this invention.

The inductive write transudcer is configured in two basic designs.

(1) Crossed wires on opposite sides of the magnetic film, which requires a coincidence to write.

(2) A single coil, which writes by itself.

There are variants of these basic configurations. For example, the crossed wires may be straight or each may itself be a coil. Crossed single-loop coils provide an advantage over crossed straight wires in that the coils require a smaller current to write on a given area of useful recording information. Additional possibilities arise when these write configurations are combined with the magnetoresistive read transducer. In particular, for the single coil the read transducer may be on opposite sides of the magnetic film from the coil, between the coil and the film, or inside the coil. Two basic configurations are shown in FIGS. 2a and 3.

Figure 2A:
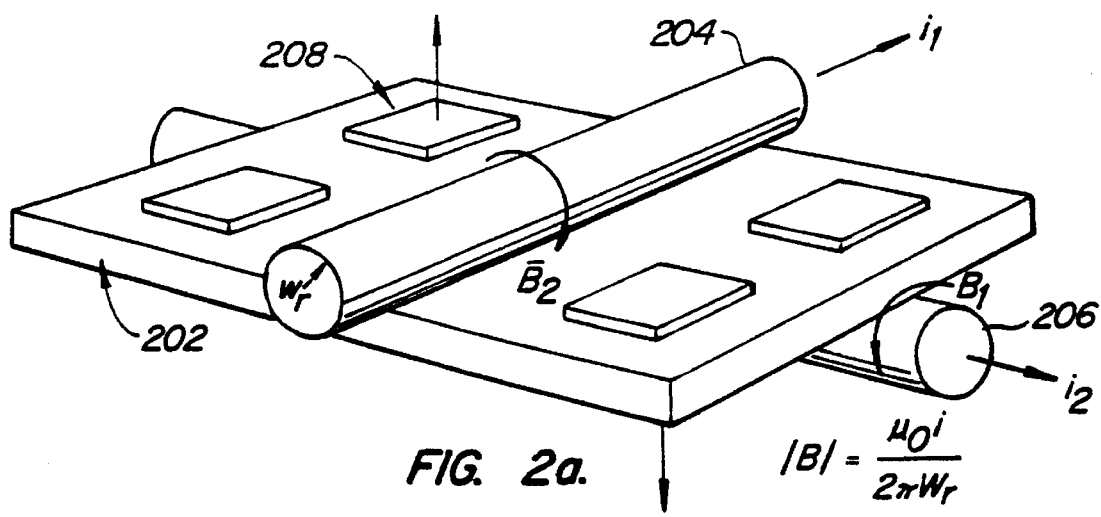
FIG. 2a illustrates a transducer configuration of a single cell, comprising two crossed wires to write in coincidence and four magnetoresistive read transducers, used in transferring data between an array of transducer cells and magnetic memory in accordance with the embodiment of the invention shown in FIG. 1; the write transducer also provides the biasing field needed for the read transducer.
Figure 2B:
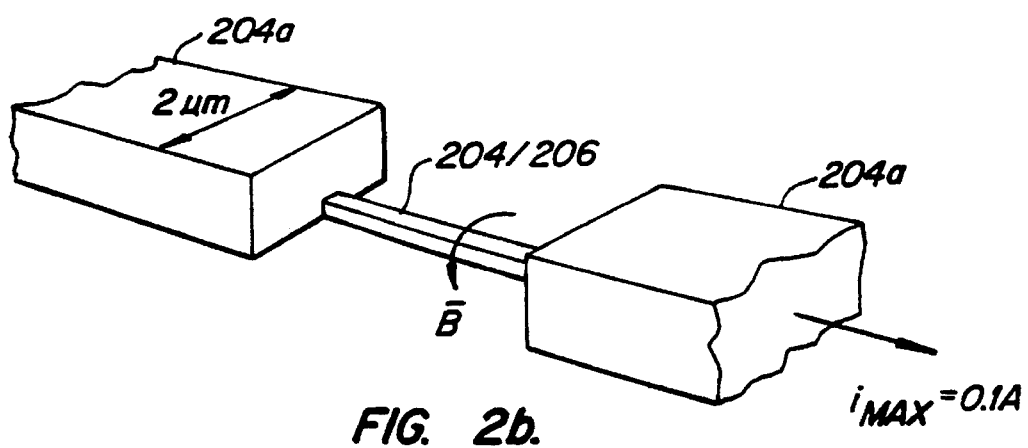
FIG. 2b illustrates details of the write lines.

FIG. 2a illustrates a particular embodiment of a write transducer utilized herein. As shown in FIG. 2a, the transducer is used to write on a ferromagnetic film 202. On one side of the ferromagnetic film a first wire or conductor 204 is placed, while a second conductor 206 is placed on the side of the material opposite the first conductor and in a direction perpendicular to that of the first conductor. Writing on the media is achieved by flowing a current $i_1$ through the first conductor and a current $i_2$ through the second conductor. When current pulses flow through the lines, magnetic induction anisotropically encompasses the wires according to the right hand rule. Accordingly, there is either constructive or destructive interference within the storage medium. The direction and the nature of the interference (i.e., constructive or destructive) dictates the state of magnetization of the domains within the medium at the four quadrants adjacent to the intersection of the write lines. The four possible directions within the medium correspond to the binary 1 or 0 states. Reading is achieved via read transducers 208 in the four quadrants surrounding the wires. FIG. 2b illustrates details of the write line(s) 204, 206. As shown, the write lines will include generally larger (e.g., 2×1 μm) portions 204a outside of the cell and a generally smaller (e.g., 0.1 μm²) portion within the cell, the cell having a length of, e.g., 3 μm.

Figure 3:
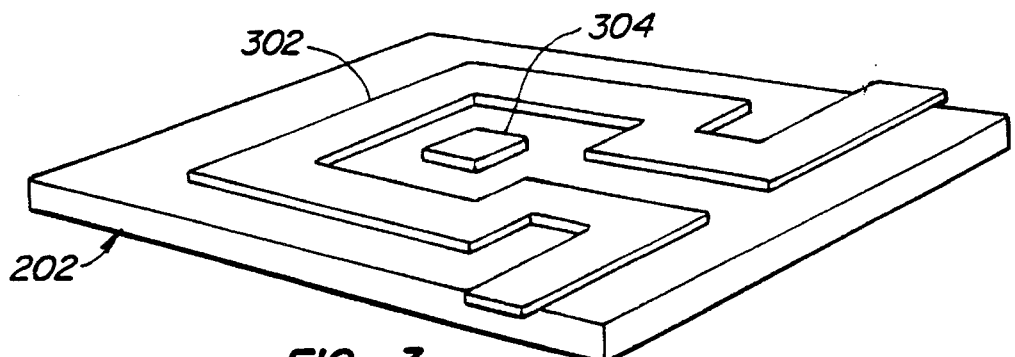
FIG. 3 illustrates a transducer configuration of a single cell, comprising a single loop to write and a single magnetoresistive read transducer, used in transferring data between an array of transducer cells and magnetic memory in accordance with the embodiment of the invention shown in FIG. 1; the write transducer also provides the biasing field needed for the read transducer.

FIG. 3 illustrates another embodiment of a write transducer. In this embodiment a conductor 302 is patterned in the form of a loop on or under a substantially planar surface of a ferromagnetic material. In this embodiment, current flowing through the loop 302 is sufficient to cause a reversal in the direction of magnetization in the magnetic media. Reading is achieved with a read transducer 304. In both of the above embodiments, the size of the various conductors may be extremely small using VLSI fabrication techniques. For example, in some embodiments the conductors have a size of about 0.1 to 10, preferably about 0.1 to 5 microns, and more preferably 1 micron or less.

The write transducer, as an inductive line, must be minimally resistive and "nonmagnetic." There are several materials options; listed in order of preference, these are aluminum (1% Si alloy), gold, molybdenum, or tungsten. These have electrical conductivities of 377, 452, 187, and 189 kMhos/cm, respectively, and melting points of 933, 1338, 2890, and 3680K, respectively. Aluminum is the metal of choice in planar IC processes. The exception is for process flows, which have subsequent high-temperature (>=600° C.) steps; in this case, gold is preferred. Molybdenum and tungsten are special-applications metals which have somewhat lower conductivity but extremely high melting points.

2. Read Transducers

Complementary to the write transducer is the detection, or read transducer. This device senses the magnetic state of an individual cell without altering it and provides a means whereby the information can be transferred to the support electronics. There are two basic types of read transducers. First, and more common, is the magnetic induction type which operates according to Faraday's law, generating a current when a remanent magnetic field changes with time in the volume of the transducer; this type of read transducer always requires motion of the magnetic medium in relation to the transducer. The second type of read transducer depends on flux rather than on the rate of change of flux, as is the case with inductive read transducers. Unlike the inductive read transducer, the flux-sensitive read transducer does not require any motion relative to the storage medium; as a result, this is the most appropriate type transducer for the storage system herein. Flux-sensitive transducers include those based on a change in resistance (magnetoresistive effect), change in electric field (Hall effect), and modulating the reluctance of a ring core (flux gate). A magnetoresistive read transducer is preferred because this is presently the most highly developed flux-sensitive reproducing technology. A magnetoresistive material changes absolute resistivity according to the magnetic flux through the material. Consequently, a magnetoresistive read transducer will have a differing resistivity when the storage cell in proximity to the transducer is in one or the other magnetized state.

There are several preferred characteristics of magnetoresistive read transducers in this embodiment:

(1) The read transducer should have a low resistivity (in the absence of any magnetic field) so that the signal-to-noise ratio (S/N) is maximized. This is crucial if the read transducer is to interface effectively with the detection electronics in support circuitry.

(2) The read transducer should have a low magnetization, M. Neither the write transducer nor the recording medium, both of which are in proximity with the read transducer, can be allowed to create either hysteresis or eddy currents within the read circuitry, which could create an ambiguity in the detection process.

(3) The read transducer should be singly anisotropic so that there is no cross-talk between adjacent binary data cells.

(4) The read transducer should have a low coercivity so that the device responds to digital switching of the recording medium with sufficient bandwidth and S/N. These constraints can be satisfied through judicious layout of the transducer within the recording cell and proper selection of the magnetoresistive material, as outlined below.

One or both of two materials for the read transducer are provided according to preferred embodiments of the invention. The first is $Ni_{81}Fe_{19}$. This is a well known ferromagnetic material which is commonly used in thin-film applications either by evaporation, sol-gel deposition, or sputtering. This material has an excess of 100 kMho/cm conductivity and (under a bias configuration) a maximum magnetoresistive ratio of 0.025. The relative permeability is 2,800 and the coercivity is less than 90 Oe, making this material appear applicable to the read transducer according to the requirements previously outlined.

A second material used in some embodiments is CoFeNi alloy. This can be deposited in like manner to the FeNi alloy; however, this material has a higher conductivity (140 kMho/cm) and three times the magnetoresistive ratio. Consequently, it is believed that CoFeNi can give a better signal-to-noise ratio. The magnetization and coercivities of the two materials are comparable. Chemical contamination from dissociated Co should be limited in the fabrication process since this element is a significant deep level in silicon and could contaminate process equipment if sufficient levels are liberated.

Either of the materials for the read transducer will, under appropriate biasing, produce a differential voltage between the 1 and 0 states that is sufficient to be read by the support electronics via suitable conductors. This voltage is also sufficient to overcome any interference from magnetic Barkhausen noise, which commonly arises from domain boundaries in single or near-single domain magnetic systems such as in the one described herein.

Recent research on materials with very high magnetoresistive ratios shows values up to 0.5. A material with such a high value of this ratio, and compatible with other requirements, would eliminate the need to rewrite and reread. This, in turn, would cut down the read time by a factor of 3–5.

Since the magnetoresistive materials are ferromagnetic, the read transducers may in some embodiments themselves serve as the storage medium.

B. Micromachine Embodiment

One implementation of transducers for transferring data by means of microscopic devices with microscopic motion relies on the inductive effect for both the read and write operations. The transducer comprises a wire at the end of the radial component of a rotating microdevice (microrotor). Motion of the wire through the magnetic field will induce a current in the wire (read), and applying a current to the wire will generate a magnetic field that produces a pattern on the recording medium (write). The data to be written are encoded as a time-varying signal impressed on the end of the wire of the radial component of the microrotor. The microrotor then creates, on the data disk, a spatially varying pattern that reproduces the pattern encoded in the time-varying signal. The reading process reconverts the recorded magnetization pattern into a time-varying electrical signal in the wire. If the input signal is at a frequency $f_1$ and the microdevice of radius r is rotating at a frequency $f_2$, a magnetization pattern will be recorded at a wavelength $$\lambda = 2\pi r f_2/f_1 \qquad (3)$$

on the circumference of the circle traced out by the end of the rotating element. The time it takes the microdevice to rotate through one revolution is $$t_m = 1/f_2, \qquad (4)$$

during which the number of bits recorded on a circle of radius r on the data disk is $$m = 2\pi r/\lambda = f_1/f_2 \qquad (5)$$

Each microrotor transfers m bits serially during one full rotation; if n/m microrotors are activated in parallel, a total of n bits will be transferred in one access to the transfer board.

A second implementation by means of microdevices with microscopic motion will also rely on a microrotor and the inductive effect. Each microrotor will have m radial components with wires at the ends. It will transfer m bits in parallel by encoding these bits on the ends of m radial components and rotating 1/m of a revolution; that is, it will function as a stepping motor that reads or writes m bits in one step. The parallel transfer of n bits in a single transfer-board access is then made by two distinct mechanisms: parallel access of n/m microrotors, each of which transfers m bits.

The three modes (i.e., stationary magnetic transducers, and the first and second embodiments of micromachine transducers) of access by a transfer board (i.e., stationary magnetic transducers, and the first and second embodiments of micromachine transducers) are summarized in Table 1.

TABLE 1

Summary of Access Modes

| Mode | Number of Bits Accessed by Each Microdevice | Number of Microdevices Activated in Parallel | Number of Bits Accessed in Parallel |
|---|---|---|---|
| 1 | 1 | n | n |
| 2 | m | n/m | n/m |
| 3 | m | n/m | n |

C. Write/Read Circuitry

One type of transfer board built according to the method of this invention will contain one microdevice without microscopic motion for each data bit on the storage disk. The bits in any sector of the storage device are accessed in parallel, n bits at a time, by activating the corresponding n microdevices in the transfer board. The function of transfer of data is in most embodiments separated in this type of transfer board from that of accessing successive bits of data; the two functions are implemented by distinct mechanisms.

The positioning time of prior-art devices is replaced in devices based on the method of this invention by the transfer-board access time. This is the analogue of RAM access time and is dictated by a combination of propagation time, address decoding, and related electronics functions; it ranges from several ns to 200 ns. The 1-bit data-transfer time depends in general on the particular transducer utilized but is comparable to prior art devices; it can be in the range 40 ns to 1 µs. The data-access time now becomes the sum of two times:

data-access time=transfer-board access time+ data-transfer time

The total data-access time of approximately 1.2 µs/sector is to be compared with 24.6 ms/sector for the IBM 3380 cited above. This corresponds to a reduction in I/O time by a factor of about 20,000. The limiting time for I/O in the method of this invention is seen to depend on the relative magnitudes of the transfer-board access time and the data-transfer time, in contrast to prior-art devices, for which the limiting factor is the positioning time.

In the application of the method of this invention to data transfer, as implemented by microdevices without microscopic mechanical motion, access time is reduced by a factor of several orders of magnitude compared to prior art disk-drive technology on account of two elements: positioning time is eliminated, with its function being replaced by electronic switching, and data-transfer time is reduced substantially because the serial transfer of data in prior art is replaced by parallel transfer of these data. In preferred embodiments, individual data locations are accessible under the direction of an addressing scheme and associated circuitry.

One type of transfer board built according to the method of this invention will include microdevices without microscopic motion. One implementation of this type of transfer board will use different transducers on the array for the read and write operations with magnetic storage. A magnetoresistive element will be utilized to sense the magnetization, and a current through a coil of wire will generate the switching field required to impress a specific orientation of the magnetization on the storage medium. An auxiliary microstructure in close proximity to the magnetoresistive element will provide the bias field required to produce different magnetization. In the embodiments illustrated in FIGS. 2a, 2b, and 3, the bias field is provided by the write transducers, using smaller currents than those required to write. In one embodiment, the coil is fabricated by using layered structures formed using conventional semiconductor fabrication techniques such as molecular-beam epitaxy. The calculations for determination of required magnetic field strength associated with the recording of signals on magnetic media and with the corresponding reproduction of signals from such media are well known to those skilled in the art. With suitable modifications to account for differences between the read/write head and the transfer board, the calculations of the magnetic field that must be produced by the coil to switch the orientation of the magnetization and of the field to be sensed by the magnetoresistive element in the transfer board therefore are the same as those used in the prior art.

A second type of transfer board built according to the method of this invention will contain microdevices with microscopic motion. Motion may be vibrational, rotational, or laterally translational. All of these motion types are known in the art and have been demonstrated.

Figure 4A:
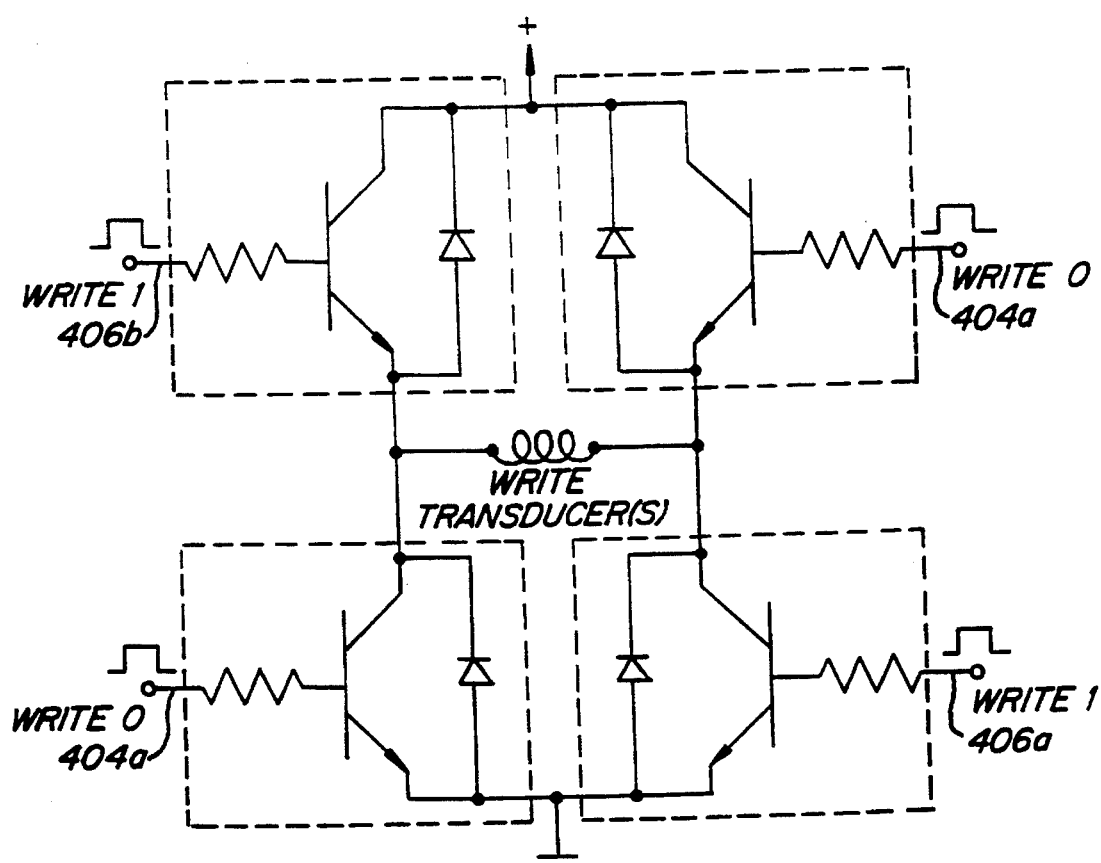
FIG. 4a is a circuit used in writing data to a magnetic medium in accordance with the cell configuration shown in FIG. 2.
Figure 4B:
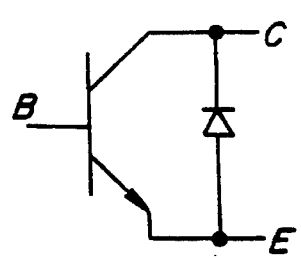
Figure 4C:
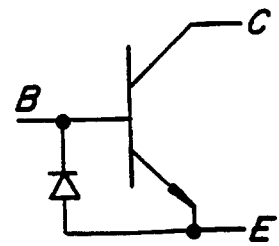

The use of write transducers that provide coincidence between two crossed write lines permits driving each write line by a single write circuit. FIG. 4a shows an exemplary write circuit 402. The particular embodiments shown therein may be implemented as discrete components such as on a breadboard, although most embodiments will be implemented as VLSI circuits on a single substrate. The inductor symbol represents one or more write transducers in series. The two WRITE 0 lines 404a and 404b are driven by identical signals, as are the two WRITE 1 lines 406a and 406b. No current flows in the circuit when WRITE 0 and WRITE 1 are low (near 0 V). Current flows to the right through the inductor symbol when WRITE 0 is low and WRITE 1 is high (at least +5 V), and current flows to the left through the inductor symbol when WRITE 0 is high and WRITE 1 is low; WRITE 0 and WRITE 1 are not permitted to be high at the same time. Alternative transistor/diode configurations are shown in the lower portion as FIGS. 4b and 4c.

The + supply voltages of all write circuits driving the horizontal (row) write lines are provided by a single power supply and the + supply voltages of all write circuits driving the vertical (column) write lines are provided by another power supply.

Figure 5:
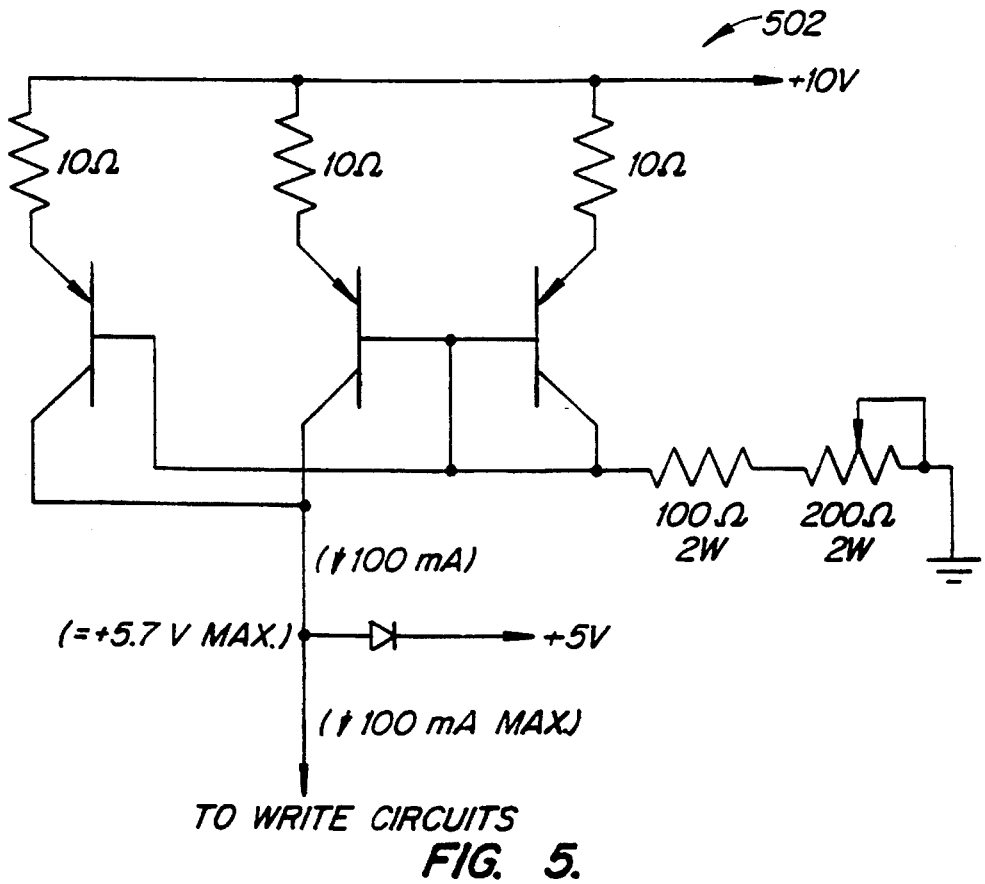
FIG. 5 illustrates a power supply to drive the write circuits in accordance with the cell configuration shown in FIG. 2.

FIG. 5 shows a power suppy 502 for use in the breadboard; a similar circuit may be used in an integrated circuit. The circuit of FIG. 5 provides a current of 100 mA when a write circuit is turned on by a high WRITE 0 or WRITE 1 and it provides a voltage of about +5.7 V when all write circuits are turned off; it can establish a current of 0.1 amp in less than 20 ns in an inductance of up to 1 µH.

The circuitry required for writing becomes more extensive when the write transducers do not provide coincidence, as is the case for a write transducer consisting of a single loop. In such a case, a write circuit of FIGS. 4a, 4b, or 4c has to be included in each cell of the array; however, only one power supply (instead of two) of FIG. 5 is required for an array.

In some embodiments the write transducers cannot carry the write current of 100 mA on a steady-state basis. This is handled by limiting the duty cycle of writing in any given location. An external shift-register memory is used to retain the locations of write operations performed recently (e.g., within the last 10 data-access times) and inhibits writing in these locations.

For the coincidence design, which needs write circuitry only at the edge of the array, and for which the cell size is therefore potentially smaller than the noncoincidence design, the size advantage favors MOS technology. For the noncoincidence design, which requires bipolar write circuitry in every cell, the additional size of the bipolar read circuitry makes relatively little difference in the overall area; in this case, it is therefore preferable to use bipolar read circuitry so as to avoid mixing two different technologies in the cells.

Figure 6:
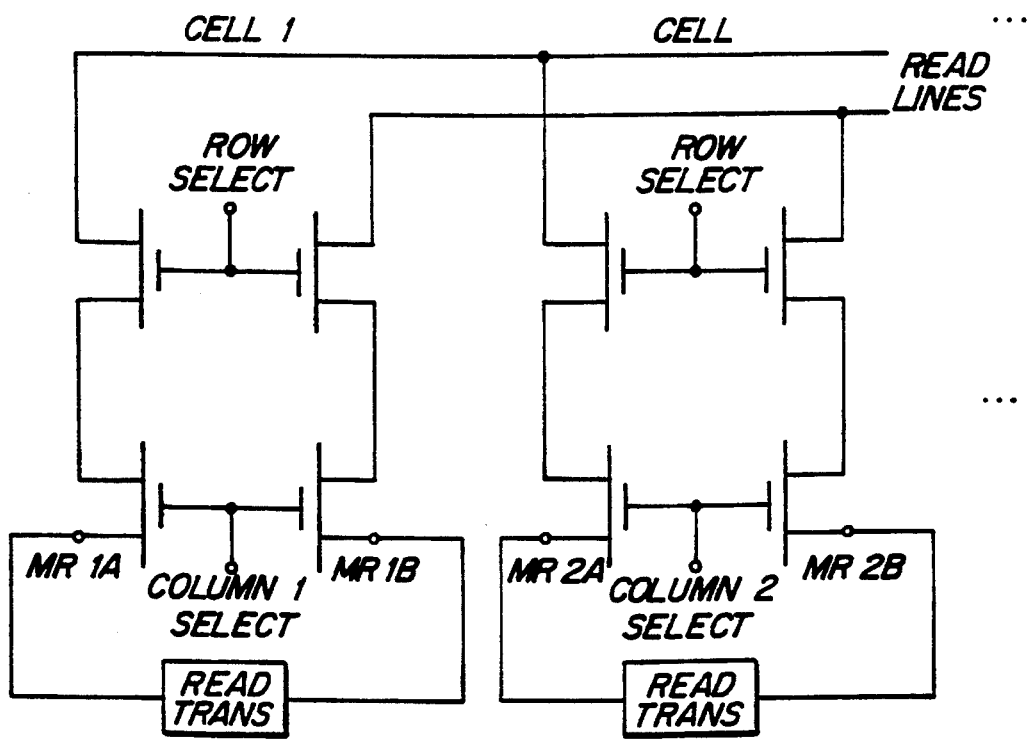
FIGS. 6 and 7 show (MOS and bipolar, respectively) readout-multiplexing circuits for the first two cells in an unspecified row.

FIG. 6 illustrates a readout multiplexing system 602 using MOS devices; it shows in detail the first two cells in an unspecified row. The MOS devices can be laid out in a small chip area, permitting a small cell area. Expected size of the entire cell-transducers plus electronics—is about 10 μm×10 μm according to one embodiment of the invention. Reading is achieved by activating the appropriate row and column address and measuring, for example, the resistance of the read transducer.

Figure 7:
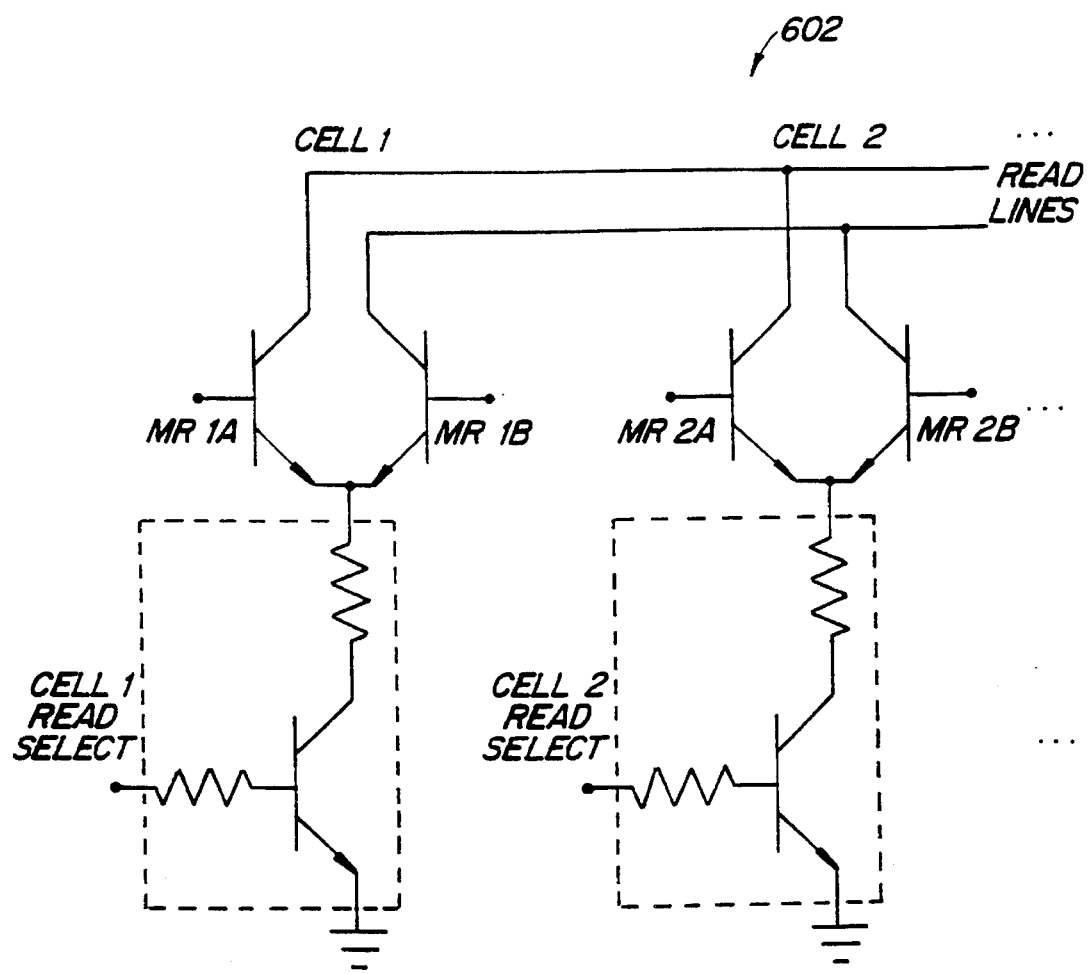

FIG. 7 illustrates a readout multiplexing system 702 using bipolar transistors; details of cell selection are not shown. This circuit is expected to use more chip area than the MOS circuit of FIG. 6. The expected size of the entire cell is about 30 μm×30 μm. A subarray containing 32×32 such cells will measure about 0.1 mm×0.1 mm; the dimensions of a 1 megabit chip containing 32×32 such subarrays will be about 1.5"×1.5". With the connections and supporting circuitry included, a package about 3"×3"×1" in dimensions is quite reasonable for the prototype. MR1A and MR1B are connected to a magnetoresistive readout transducer in one cell and, likewise, MR2A and MR2B are connected to a second cell. When cell 1 is selected, the resistance is measured across the magnetoresistive element via the now connected read lines.

Both read designs perform the read operation in less than 100 ns. The total read time on the breadboard is nonetheless projected at 1 μs for the following reason. Typical magnetoresistive materials presently used in read heads have a fractional resistance change in the range of 2–7%. It may therefore be necessary to read, rewrite, reread, and compare the values to get reliable results on a breadboard design. Hence, in such breadboard designs a factor of better than 10 is provided between the electronic read operation and the total read time for the breadboard. This technique of rewriting and rereading will not have to be incorporated into production designs in some embodiments.

It should be noted that in both the read and write designs, data are selectively addressable, i.e., the reading and writing of an individual data bit or group of data bits may be achieved in much the same manner as RAM circuits and the like. It is not necessary to scan through all or most of the data bits in, for example, a raster scan fashion and select a desired data bit for use. Merely by way of example, in a computer system an address bus may have imposed on it the location of a data bit to be written or retrieved, based upon which the system addresses the identified data bit.

In typical embodiments, subarrays of 16 bits×16 bits=256 bits are built using the storage cells, and 4096 such subarrays are combined to build a 1-Mbit PRAM chip. The size of this chip is estimated to be in the vicinity of 1.5"×1.5"; it can be mounted in a 3"×3"×1" package that also includes support circuitry and connectors.

The time needed to switch a single domain is a function of the material properties in the storage medium and the inductive pulse current in the write transducer. The switching time is stated by the expression:

$$\tau = \frac{K}{\Delta i}$$

where $\Delta i$ is the write-transducer current change and K is a constant differing for each storage medium. This K value is generally described as:

$$K = \alpha H_c \tau_d x$$

where $\alpha$ is a unitless constant, $H_c$ is the coercivity, $\tau_d$ is a "damping factor" which differs for each material and x is the domain size in the switching direction. The K value, and hence the switching speed, differ for any selected storage medium; however, an example would be a 2500A Permalloy film: if the induced field >=3 Oe, then $\tau$=3 ns. Using barium ferrite, which has a smaller damping factor and a smaller domain size, will provide improved performance. In this example, a value of 3 ns is a conservatively high estimate of switching speed.

There are two features of preferred embodiments which are employed to minimize power consumption. The first is through the selection of an appropriate storage medium which has minimal coercivity and therefore switches at low inductive field values. The tradeoff in such a selection is that the coercivity must be high enough such that undesired switching from stray fields will never occur under normal conditions. If lower coercivity films are used, less power is dissipated in the write transducer during the switching operation.

The second method of conserving power is by maximizing the magnetic field generated during the write pulse. The easiest way to do this is through the use of nanotechnology in forming the write transducers: narrower write wires create greater write fields at a given current. If the necessary switching field is a fixed value (dictated by the cell design and the storage medium), then a reduction in the write wire radius provides a corresponding lesser need for write pulse current. It should be emphasized that this wire-radius reduction occurs only in the cell center (for a length of 1 μm); the remaining interconnect need not be reduced in radius. Power consumption will therefore drop proportional to $(w_r)^{-2}$ since current is inversely proportional to the $w_r$ value. The tradeoff in this wire-radius reduction is the increased cost of using finer and finer nanotechnology techniques to get the desired feature size. As dimensions are shrunk, there is an eventual point of diminishing returns.

Figure 8:
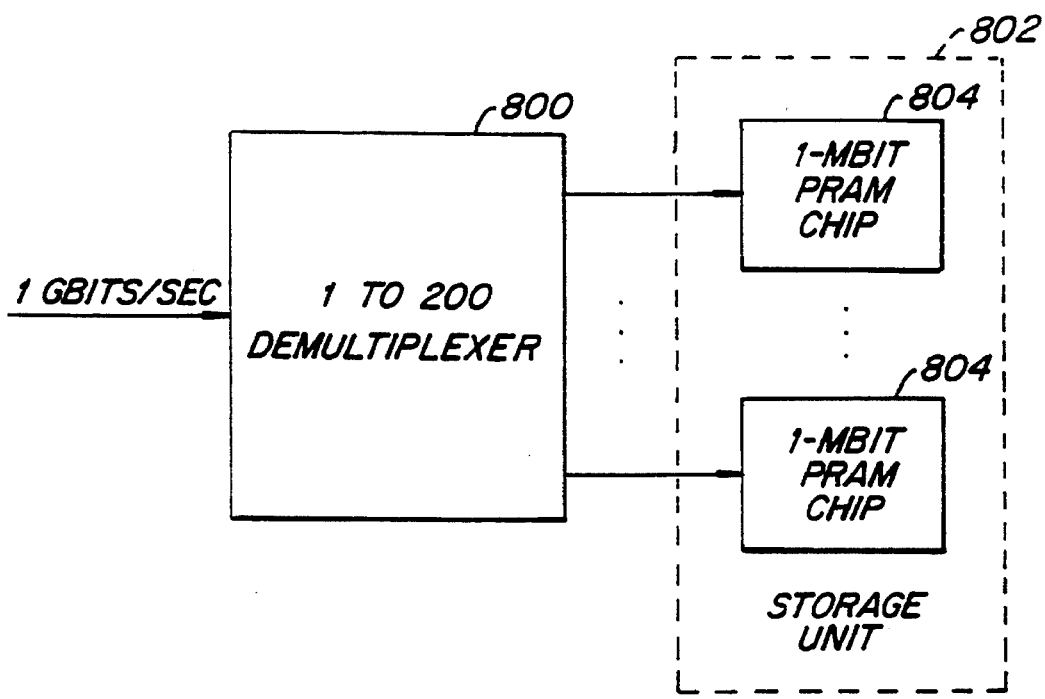
FIG. 8 is a block diagram of a high-speed serial buffer with permanent memory.

FIG. 8 shows the block diagram of a high-speed serial buffer with permanent memory. It includes a 1-to-200 demultiplexer 800 and a storage unit 802.

The input to the demultiplexer is a bit stream with a bit rate of, for example, 1 Gbit/second; i.e., with a new bit once every 1 ns. The demultiplexer has 200 output lines, each delivering a bit stream with a bit rate of 5 Mbits/second, i.e., with a new bit once every 200 ns.

The typical storage unit includes 200 bit-organized PRAM chips 804, each with a capacity of 1 Mbit and a write access time of 200 ns. The data input of each PRAM chip is connected to an output line of the demultiplexer. An addressing scheme advances the address of each PRAM chip once every 200 ns.

D. Fabrication Process

The detailed process flow in the fabrication sequence of the nonvolatile mass-storage array proposed herein is similar to an integrated-circuit flow. An example of the major steps in one process is as follows:

1. Wafer preparation and chemical cleaning
2. Thermal oxidation
3. Photopatterning #1: 1st write-line (submicron geometries)
4. Aluminum deposition
5. Liftoff patterning, 1st write-line definition 6. Ferrite film deposition
7. Photopatterning #2: storage cell
8. Dry etch storage media definition; resist removal
9. Aluminum deposition
10. Photopatterning #3: 2nd write-line (submicron geometries)
11. Low-temperature CVD insulator deposition
12. Magnetoresistive thin-film deposition
13. Photopatterning #4: read transducer delineation
14. Dry etch read resistors (submicron geometries)
15. Pyrox deposition, low-temperature
16. Photopatterning #5: contact vias
17. Dry etch contact holes
18. Wet etch ohmic contacts, strip resist
19. Photopatterning #6: interconnect metal
20. Aluminum deposition
21. Liftoff processing, interconnect delineation
22. Cover glass/nitride deposition, plasma-enhanced CVD
23. Photopatterning #7: contact pad via
24. Wafer dicing
25. Bonding and package/assembly The steps listed are the major fabrication steps; associated with each photolithography step are (average) 40 minor steps (such as cleaning, ashing, softbaking, etc.). It should be noted that this process flow includes no integrated electronics with a memory array. In preferred embodiments, the three submicron-feature lithographic steps required for the prototype will be performed either with electron-beam direct-write lithography or with x-ray lithography.

E. Representative Applications

The unique characteristics of the mass-storage system described herein lends itself to, and has direct value in, numerous high-speed data storage and retrieval systems. In general, the transfer board is vastly superior to disk and tape systems on five counts: an order-of magnitude faster data-access time, significantly greater resistance to shock and vibration, higher reliability, maintenance-free operation, and the absence of tribological problems. A partial list of specific applications includes the following.

A primary use is with computer applications requiring significant data storage and maximum access speed. An example would be artificial-intelligence processes with decision-making requirements, such as guidance systems.

Another important example is robotic systems which require sensory input and quick response actions. Any computational application benefiting from high-speed and parallel access from nonvolatile memory will benefit from this component. An example of this would be field communications systems and controllers that may experience sudden, random power loses. Typically, digital communications controllers require maximum bandwidth.

The outstandingly high resistance of the transfer board to shock and vibration is expected to lead to its use in a variety of vehicular applications: (a) heavy-duty ground vehicles, (b) surface ships and underwater vehicles, and (c) aircraft and other space vehicles; its unique combination of ruggedness and relatively small volume and weight is particularly significant for the last application.

There is also application to real-time systems which access significant amounts of stored data. A primary example is computer tomography systems. These systems typically have x-ray or ultrasonic scanners which feed enormous amounts of data to the processor in a few seconds. The data-storage requirements exceed practical RAM capabilities. Matrix reduction requirements in the computational process demand significant mass storage. Because such systems typically are attended by a party requiring immediate feedback (for example, a surgeon at the operating table), real-time operation is essential, requiring maximum access speed. Numerous other examples of real-time computational systems exist (radar arrays, tactical sensors, navigational controllers).

In any disk-intensive application—such as database searches, graphics, and most business computer applications—positioning time represents a significant portion of I/O. For all such applications, data transfer based on the transfer board herein reduces the time required for I/O by several orders of magnitude, with an attendant improvement in overall computing speed.

The system's relatively small volume and weight, coupled with its high speed for direct access, makes the transfer board ideal for medium and small computers. In serial-access applications, the principal advantages of this device are in environments requiring high resistance to shock and vibration.

Table 2 compares the PRAM (Permanent Random Access Memory) disclosed herein with other memory systems.

TABLE 2

Comparative Properties of Writable Storage Devices With Long-Term Data-Retention

| Property | Disk[1] | EAROM[2] EEROM[3] | CCD[4] | MBM[5] | PRAM[6] |
|---|---|---|---|---|---|
| Mechanical motion | Yes | No | No | No | No |
| Reliability of long-term data-retention | High | Low | Low | High | High |
| Access | Serial | Random | Serial | Serial | Random |
| Sensitivity to shock and vibration | High | Low | Low | Moderate | Low to Moderate |
| Maintenance-free operation | No | Yes | Yes | Yes | Yes |
| Access time per bit — for Kbits | Long | Short | Long | Long | Short |
| Access time per bit — for Mbits | Moderate | Short | Moderate | Moderate | Short |
| Access time per bit — for Gbits | Short | Short | Short | Short | Short |

[1]. Mechanical Disk Drive
[2]. Electrically Alterable Read-Only Memory (EAROM)
[3]. Electrically Erasable Read-Only Memory (EEROM)
[4]. Charge-Coupled Device (CCD)
[5]. Magnetic Bubble Memory (MBM)
[6]. Permanent Random-Access Memory (PRAM)

IV. Scanning Tunneling Microscope Array

Figure 9:
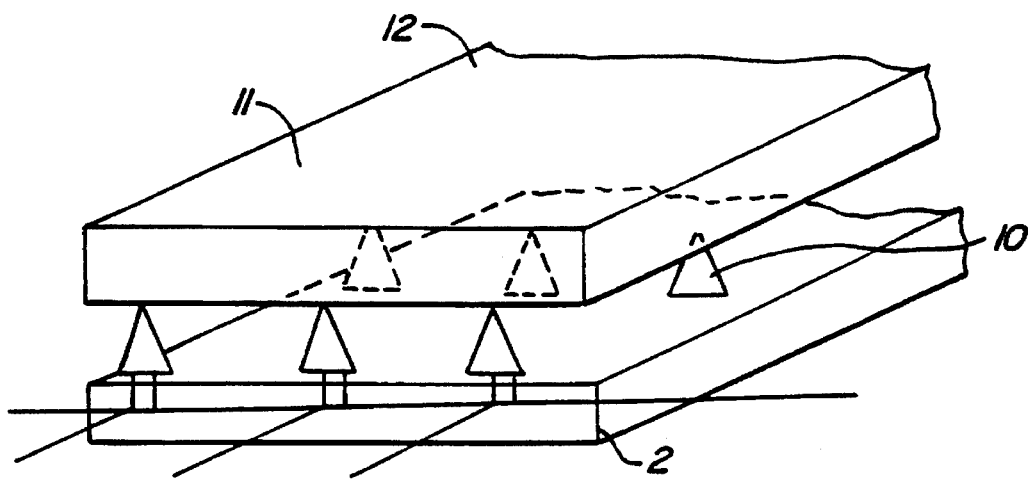
FIG. 9 illustrates an array of STM probes in accordance with the invention.

In one alternative embodiment, the transducers are an array of STM probes. Such STM probes are described in, for example, Kenny et al., "A Micromachined Silicon Electron Tunneling Sensor," Proceedings IEEE Micro Electro Mechanical Systems, Feb. 11–14, 1990, which is incorporated herein by reference. STM probes are fabricated in an array, in accordance with FIG. 9, and are accessed by applying a sufficient voltage between one or more selected STM probes 10 and a sample 12. The voltage is supplied to only the selected STM probes, and the tunneling current between the selected STM probe and the substrate is measured. Accordingly, a relatively high resolution image of the substrate surface may be obtained without the need for physical scanning of the sample surface. In some embodiments, the array of STM probes is moved slightly (up to about the separation distance between probes) so as to obtain a more complete "picture" of the sample surface. In some embodiments, both x and y movement may be provided. Again, however, the amount of movement needed will be greatly reduced. With the limited movement (or total lack of movement) provided by the array of STM probes herein, the material used in fabrication may be selected from a broader array of materials than prior art devices. For example, piezoelectric materials need not be utilized herein.

Through use of an array of STM probes it also becomes possible to study dynamic (time varying effects on a sample surface. Such dynamic effects include, for example, wave motion, thermal changes, and the like. Such dynamic effects are monitored by electronically polling the various STM probes over time, and recording the response of the various STM probes.

V. Conclusion

The above description is illustrative and not restrictive. Many variations of the invention will become apparent to those of skill in the art upon review of this disclosure. Merely by way of example, different transducer types may be utilized without departing from the scope of the invention herein. The scope of the invention should, therefore, be determined not with reference to the above description, but instead should be determined with reference to the appended claims along with their full scope of equivalents.

What is claimed is:

1. A method of obtaining a high resolution image of a substrate surface comprising the steps of:
   (a) positioning an array of STM probes such that said array of STM probes is stationary relative to said substrate surface during activation of said array of STM probes to obtain said image;
   (b) electing-spatial points at which probes of said array of STM probes are to be activated;
   (c) selecting times at which said selected STM probes are to be activated;
   (d) activating said selected STM probes at said selected times; and
   (e) measuring tunneling currents between said selected STM probes and said substrate.

2. The method as recited in claim 1 wherein said array of STM probes is a transducer array comprising:
   (a) on a common substrate, an array of individual sub-millimeter transducers;
   (b) means for selecting a desired portion of said array of transducers for activation; and
   (c) addressing means for activating the transducers in said desired portion of said array of transducers at selected times.

3. The method as recited in claim 1 further comprising the step of placing said array of STM probes in close proximity to said substrate.

4. The method as recited in claim 1 wherein each probe of said array of STM probes is individually accessible.

5. The method as recited in claim 4 wherein access time for a probe is substantially independent of a location of said probe in said array of STM probes.

6. A method of measuring dynamic substrate surface effects comprising the steps of:
   (a) positioning an array of STM probes such that said array of STM probes is stationary relative to said substrate surface during activation of said array of STM probes;
   (b) selecting spatial points at which probes of said array of STM probes are to be activated:
   (c) selecting times at which said selected STM probes are to be activated;
   (d) activating said selected STM probes at said selected times;
   (e) measuring tunneling currents between said selected STM probes and said substrate;
   (f) monitoring said dynamic effects over time by electronic polling of said selected STM probes over time; and
   (g) recording the measured response from said polling of STM probes.

7. The method as recited in claim 6 further comprising the step of:
   adjusting said array probe tips prior to said measurement of dynamic effects.

8. The method as recited in claim 6 further comprising the step of placing said array of STM probes in close proximity to said substrate.

9. The method as recited in claim 6 wherein each probe of said array of STM probes is individually accessible.

10. The method as recited in claim 9 wherein access time for a probe is substantially independent of a location of said probe in said array of STM probes.

11. The method as recited in claim 6 wherein said dynamic substrate surface effects are selected from the group consisting of wave motion and thermal change.

* * * * *